United States Patent
Wu

(10) Patent No.: US 11,218,166 B1
(45) Date of Patent: Jan. 4, 2022

(54) EARLY CONVERGENCE FOR DECODING OF LDPC CODES

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd.

( * ) Notice: Subject to any disclaimer, the term of this patent is extended or adjusted under 35 U.S.C. 154(b) by 0 days.

(21) Appl. No.: 17/306,057

(22) Filed: May 3, 2021

(51) Int. Cl.
*H03M 13/00* (2006.01)
*H03M 13/11* (2006.01)

(52) U.S. Cl.
CPC ...... *H03M 13/1117* (2013.01); *H03M 13/116* (2013.01)

(58) Field of Classification Search
CPC .......... H03M 13/1117; H03M 13/116
See application file for complete search history.

(56) References Cited

U.S. PATENT DOCUMENTS

| | | | | |
|---|---|---|---|---|
| 8,826,109 B2* | 9/2014 | Zhang | ............... | H03M 13/6343 714/780 |
| 2011/0154150 A1* | 6/2011 | Kang | ................. | H03M 13/1108 714/752 |
| 2011/0293045 A1* | 12/2011 | Gross | ...................... | H04L 1/005 375/340 |
| 2014/0068381 A1* | 3/2014 | Zhang | ............... | H03M 13/6331 714/770 |

OTHER PUBLICATIONS

Chen et al., "Reduced-Complexity Decoding of LDPC Codes", IEEE Transactions on Communications, vol. 53, No. 8, Aug. 2005, pp. 1288-1299.
Kim et al., "A Reduced-Complexity Architecture for LDPC Layered Decoding Schemes", IEEE Transactions on Very Large Scale Integration (VLSI) Systems, vol. 19, No. 6, Jun. 2011., pp. 1099-1103.
Mansour et al., "High-Throughput LDPC Decoders", IEEE Transactions on Very Large Scale Integration Systems, vol. 11, No. 6, Dec. 2003, pp. 976-996.
Richardson et al., "The Capacity of Low-Density Parity-Check Codes Under Message-Passing Decoding", IEEE Transactions on Information Theory, vol. 47, No. 2, Feb. 2001, pp. 599-618.

* cited by examiner

*Primary Examiner* — Samir W Rizk
(74) *Attorney, Agent, or Firm* — Van Pelt, Yi & James LLP

(57) ABSTRACT

Low-density parity-check (LDPC) encoded data with one or more errors and information associated with an early convergence checkpoint are received. The information associated with the early convergence checkpoint is used to perform LDPC decoding on the LDPC encoded data up to the early convergence checkpoint and generate a decoded codeword where the early convergence checkpoint is prior to a first complete iteration of the LDPC decoding. It is determined whether the LDPC decoding is successful and in the event it is determined that the LDPC decoding is successful, the decoded codeword is output.

20 Claims, 13 Drawing Sheets

400 Layered Min-Sum Decoding Example (Without Early Convergence)

Initialization: $\hat{L}_1^{(j)} = \hat{L}_2^{(j)} = 0, \forall j \in C;\ Q_i = L_i^{ch}, \forall_i \in V;\ \mathcal{L}=0;\ v=0;\ \gamma=0$

Iteration:

1: for $j=0,1,2,...,m-1$ do ← 406
2:   for $\forall j \in \mathcal{J}$ do
3:     Initialize $L_1^{(j)} = L_2^{(j)} = \infty,\ i_{L_1}^{(j)} = 0,\ s^{(j)} = 0$
4:     for $\forall i \in V(j)$ do
5:       Read (new) $\{s^{(j_i)}, i_{L_1}^{(j_i)}, \hat{L}_1^{(j_i)}, \hat{L}_2^{(j_i)}\}$, where $j_i$ is the preceding layer of VN $i$
6:       Compute $L_{j_i \to i}^{new} \leftarrow \text{sign}(s^{(j_i)} \oplus s_{i \to j_i}) \cdot \begin{cases} \hat{L}_1^{(j_i)}, & \text{if } i \neq i_{L_1}^{(j_i)} \\ \hat{L}_2^{(j_i)}, & \text{if } i = i_{L_1}^{(j_i)} \end{cases}$
7:       Read $Q_i$ and Compute $P_i \leftarrow Q_i + L_{j_i \to i}^{new}$
8:       Update and save decoded bit $v_i \leftarrow \text{hd}(P_i)$, and syndrome $\gamma \leftarrow \gamma \oplus (v_i^{old} \oplus v_i^{new}) \cdot h_j$.
9:       If $\gamma = 0$ and beyond the first iteration, then return the decoded codeword $\bar{V}$.
10:      Read (old) $\{s^{(j)}, i_{L_1}^{(j)}, \hat{L}_1^{(j)}, \hat{L}_2^{(j)}\}$.
11:      Compute $L_{j \to i}^{old} \leftarrow \text{sign}(s^{(j)} \oplus s_{i \to j}) \cdot \begin{cases} \hat{L}_1^{(j)}, & \text{if } i \neq i_{L_1}^{(j)} \\ \hat{L}_2^{(j)}, & \text{if } i = i_{L_1}^{(j)} \end{cases}$
12:      Compute (possibly also saturate) and save $Q_i \leftarrow P_i - L_{j \to i}^{old}$.
13:      Update and save $s_{i \to j} = \text{hd}(Q_i)$
14:      Update (new) $s^{(j)} \leftarrow s^{(j)} \oplus s_{i \to j}$
15:      Update (new) $\{i_{L_1}^{(j)}, L_1^{(j)}, L_2^{(j)}\} \leftarrow \{i_{L_1}^{(j)}, L_1^{(j)}, L_2^{(j)}, \{i, |Q_i|\}\}$
16:     end for
17:   end for
18:   Normalize $\hat{L}_1^{(j)} = \lfloor \alpha \cdot L_1^{(j)} + \beta \rfloor,\ \hat{L}_2^{(j)} = \lfloor \alpha \cdot L_2^{(j)} + \beta \rfloor,\ j \in \mathcal{J}$
19:   Save $\hat{L}_1^{(j)}, \hat{L}_2^{(j)}, s^{(j)}$ and $i_{L_1}^{(j)},\ j \in \mathcal{J}$.
20: end for

FIG. 4
(Prior Art)

$$\bar{H} \sim 700a \begin{bmatrix} 0 & I_0 & 0 & 0 & I_1 & 0 & 0 & I_2 & 0 & 0 & 0 & I_3 & 0 & I_4 & I_5 & I_6 \\ I_7 & 0 & I_8 & I_9 & 0 & I_{10} & 0 & I_{11} & 0 & I_{12} & 0 & I_{13} & I_{14} & 0 & 0 & 0 \\ 0 & I_{15} & 0 & I_{16} & I_{17} & 0 & I_{18} & 0 & I_{19} & 0 & I_{20} & 0 & I_{21} & 0 & I_{22} & 0 \\ I_{23} & 0 & I_{24} & 0 & 0 & I_{25} & I_{26} & I_{27} & 0 & I_{28} & 0 & I_{29} & 0 & I_{30} & 0 & I_{31} \\ 0 & I_{32} & I_{33} & I_{34} & I_{35} & 0 & I_{36} & 0 & I_{37} & 0 & I_{38} & 0 & 0 & 0 & I_{39} & 0 \\ I_{40} & 0 & 0 & 0 & 0 & I_{41} & 0 & 0 & I_{42} & I_{43} & I_{44} & 0 & I_{45} & I_{46} & 0 & I_{47} \end{bmatrix}$$

$$\bar{H}_{per}{\sim} \begin{bmatrix} I_{23} & 0 & I_{24} & 0 & 0 & I_{25} & I_{26} & I_{27} & 0 & I_{28} & 0 & I_{29} & 0 & I_{30} & 0 & I_{31} \\ 0 & I_{15} & 0 & I_{16} & I_{17} & 0 & I_{18} & 0 & I_{19} & 0 & I_{20} & 0 & I_{21} & 0 & \boxed{I_{22}} & 0 \\ 0 & I_0 & 0 & 0 & I_1 & 0 & 0 & I_2 & 0 & 0 & 0 & I_3 & 0 & I_4 & I_5 & I_6 \\ I_7 & 0 & I_8 & I_9 & 0 & I_{10} & 0 & I_{11} & 0 & I_{12} & 0 & I_{13} & I_{14} & 0 & 0 & 0 \\ 0 & I_{32} & I_{33} & I_{34} & I_{35} & 0 & I_{36} & 0 & I_{37} & 0 & I_{38} & 0 & 0 & 0 & I_{39} & 0 \\ I_{40} & 0 & 0 & 0 & 0 & I_{41} & 0 & 0 & I_{42} & I_{43} & I_{44} & 0 & I_{45} & I_{46} & 0 & I_{47} \end{bmatrix}$$

EARLY CONVERGENCE FOR DECODING OF LDPC CODES

BACKGROUND OF THE INVENTION

Low-density parity-check (LDPC) codes are a type of error correction code. In some applications, LDPC codes are used to correct for errors that are introduced by a (e.g., noisy) communication channel or by (e.g., degrading) storage media. New techniques which improve the performance of LDPC systems would be desirable. For example, reducing the processing time would be desirable because the error corrected data is output sooner and/or less processing resources or power is consumed.

BRIEF DESCRIPTION OF THE DRAWINGS

Various embodiments of the invention are disclosed in the following detailed description and the accompanying drawings.

FIG. 4 is a diagram illustrating an example of a layered min-sum decoding process without early convergence.

FIG. 7A is a diagram illustrating an embodiment of QC-LDPC circulants in an $\overline{H}$ matrix that are processed during a first layer.

FIG. 7B is a diagram illustrating an embodiment of QC-LDPC circulants in an $\overline{H}$ matrix that are processed during a second layer.

FIG. 7C is a diagram illustrating an embodiment of QC-LDPC circulants in an $\overline{H}$ matrix that are processed during a third layer.

FIG. 9 is a diagram illustrating an embodiment of a permuted $\overline{H}$ matrix.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a low-density parity-check (LDPC) decoding technique that checks for early convergence are described herein. As will be described in more detail below, a (e.g., layered min-sum) LDPC decoder performs an early termination check before a full iteration of decoding is performed (e.g., at some fractional, pre-calculated iteration count). When decoding data with relatively few errors, an LDPC decoder which performs the techniques described herein can output the error corrected data earlier than other types of LDPC decoders which reduces processing time and/or conserves power. The following figure describes one LDPC decoding embodiment with early convergence.

Figure 1:
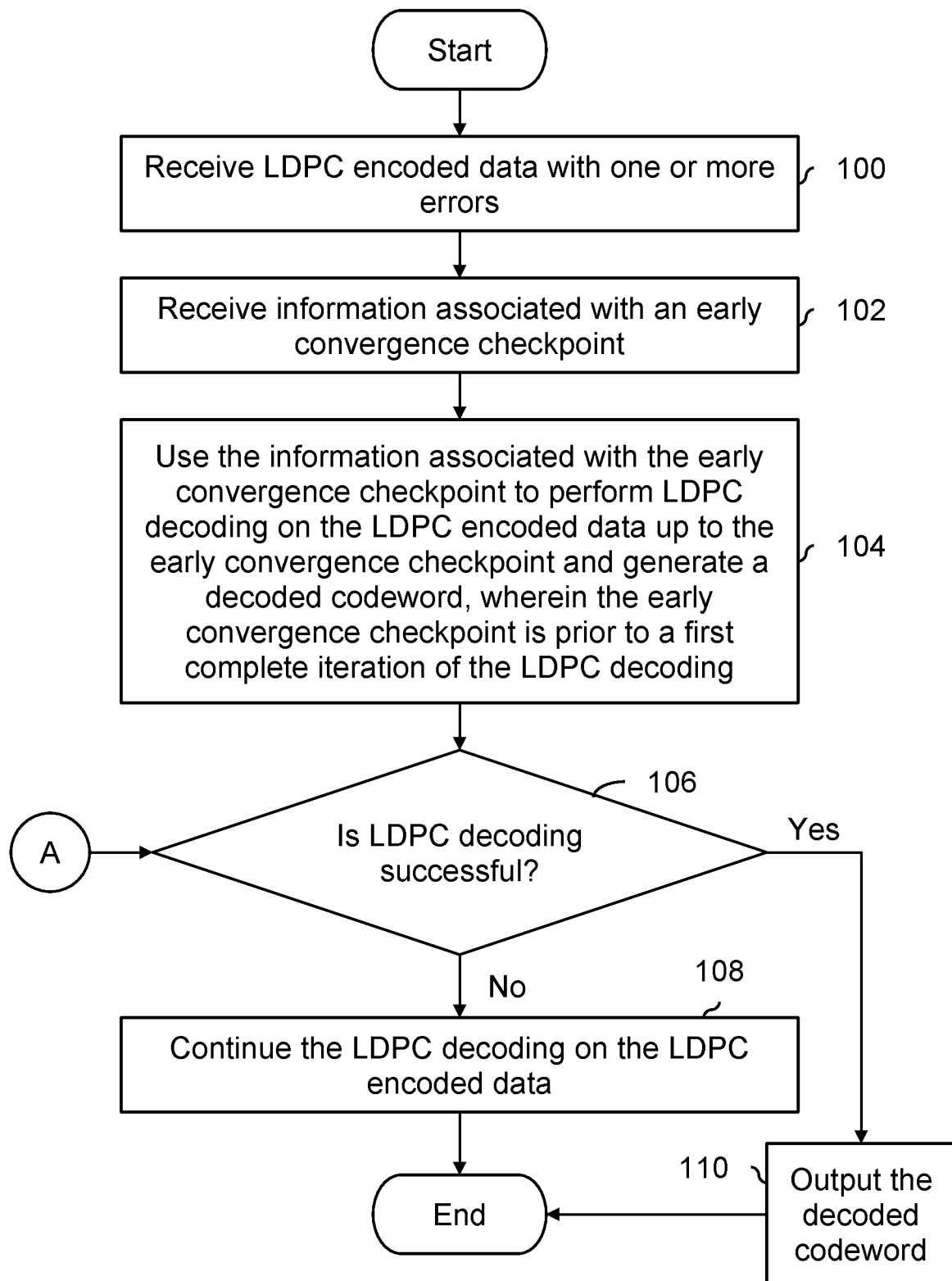
FIG. 1 is a flowchart illustrating an embodiment of a low-density parity-check (LDPC) decoding process with early convergence.

FIG. 1 is a flowchart illustrating an embodiment of a low-density parity-check (LDPC) decoding process with early convergence. In various embodiments, the process may be performed in a hardware implementation (e.g., an application-specific integrated circuit (ASIC) or field-programmable gate array (FPGA)) or a software implementation (e.g., firmware or a computer program product embodied in a non-transitory computer readable medium and computer instructions).

At 100, low-density parity-check (LDPC) encoded data with one or more errors is received. For example, the encoded data may have been received from a communication channel or read back from storage (e.g., after being stored for many years on degrading storage media) and errors were introduced into the LDPC encoded data.

At 102, information associated with an early convergence checkpoint is received. In some embodiments, the information received at step 102 is a signal (e.g., a collective monitored state signal based on monitored states) that indicates when the early convergence checkpoint has been reached or passed. In some embodiments, the information received at step 102 is a partial and/or fractional iteration where the fractional iteration is strictly greater than 0 and strictly less than 1 and the fractional iteration corresponds to the early convergence checkpoint. The LDPC decoder in such embodiments tracks the (fractional) iteration count and pauses decoding when the fractional count received at step 102 is reached.

At 104, the information associated with the early convergence checkpoint is used to perform (e.g., layered min-sum) LDPC decoding on the LDPC encoded data up to the early convergence checkpoint and generate a decoded codeword, wherein the early convergence checkpoint is prior to a first complete iteration of the LDPC decoding.

At 106, it is determined if the LDPC decoding is successful. For example, the decoded codeword generated at step 100 may or may not still include errors and decoding is not declared a success (in one example) unless the syndrome vector is all zeros or otherwise indicates all errors have been successfully removed from the decoded data.

If it is determined that decoding is successful at 106, the decoded codeword (e.g., generated at 104) is output at 110. For example, if there are only a few errors, then a fraction of a complete iteration may be sufficient to remove all of the errors. With other types of LDPC decoders, the decoder completes at least one complete iteration before checking if decoding is successful. With early convergence checking, the decoded data can be output sooner and power and processing resources may be conserved when possible (e.g., only a few errors that do not require a full or complete decoding iteration).

If it is determined that decoding is not successful at 106, the (e.g., layered min-sum) LDPC decoding continues at 108 (e.g., until successful or a timeout is reached). If the resumed LDPC decoding at step 108 is successful, the decoded codeword is output. In some cases, a timeout is reached and the resumed LDPC decoding is halted; an error is then declared or a different type of decoding (e.g., stronger but slower) is attempted.

Before describing more detailed examples of the early decoding termination process shown in FIG. 1, it may be helpful to illustrate some example applications in which such a technique may be used. The following figures illustrate some example applications.

Figure 2A:
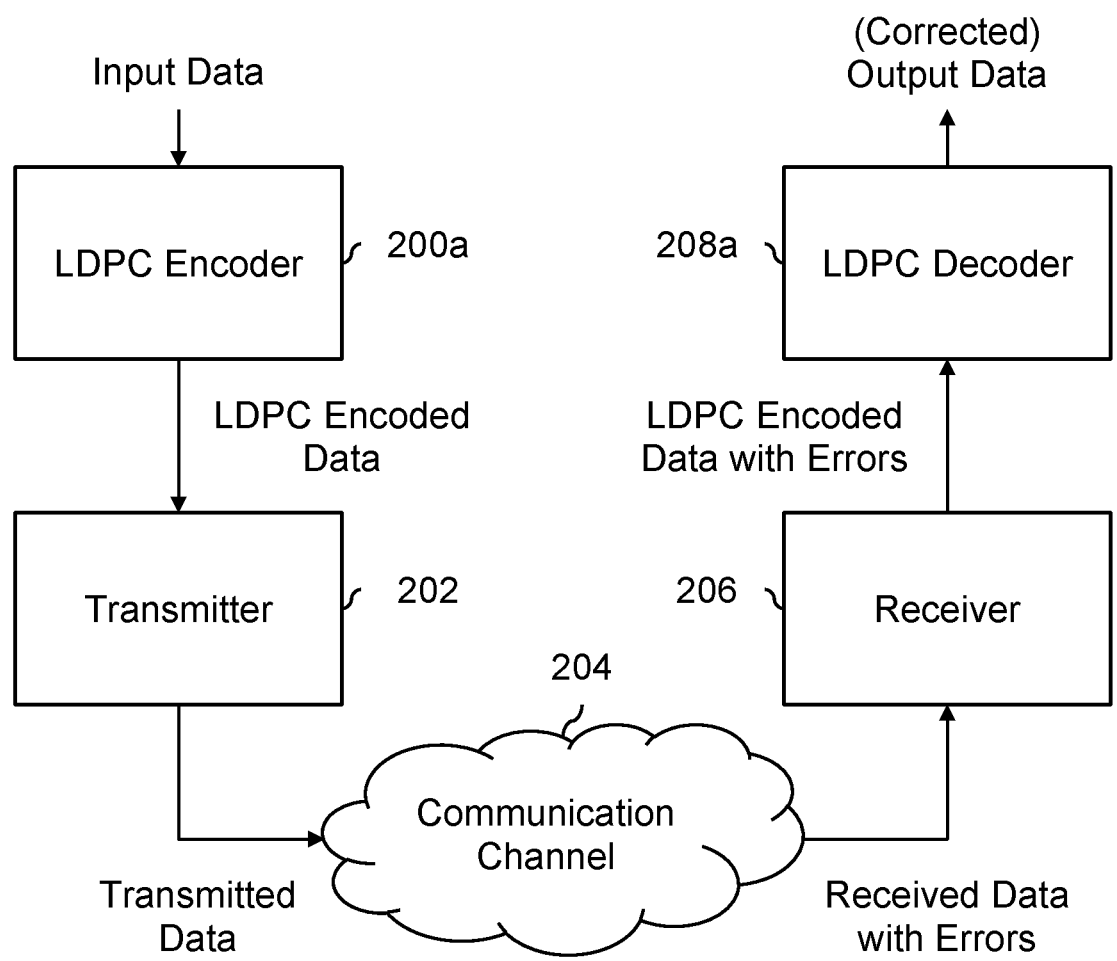
FIG. 2A is a diagram illustrating an embodiment of a low-density parity-check (LDPC) encoder and decoder used in a communications application.

FIG. 2A is a diagram illustrating an embodiment of a low-density parity-check (LDPC) encoder and decoder used in a communications application. In this example, an LDPC encoder (200*a*) inputs input data to encode before transmission. LDPC encoded data to transmit is output from the LDPC encoder (200*a*) and is passed to a transmitter (202) which modulates and/or formats the LDPC encoded data as appropriate for the particular communication channel and sends transmitted data over a communication channel (204), such as a wired or wireless channel and/or a network.

A receiver (206) coupled to the communication channel (204) inputs received data and demodulates and/or extracts LDPC encoded data with errors from the received data with errors. An LDPC decoder (208*a*) then decodes the received, compressed data and outputs the uncompressed data. In some embodiments, LDPC decoder (208*a*) performs an early decoding termination process (e.g., FIG. 1) which permits the LDPC decoding to end earlier than some other LDPC decoders, reducing delay.

The communication channel (204) introduces noise and/or errors so that the data received by the receiver (206) contains noise. Error correction encoding the data with an LDPC code prior to transmission may reduce the number of errors and/or indecipherable messages at the receiver.

Figure 2B:
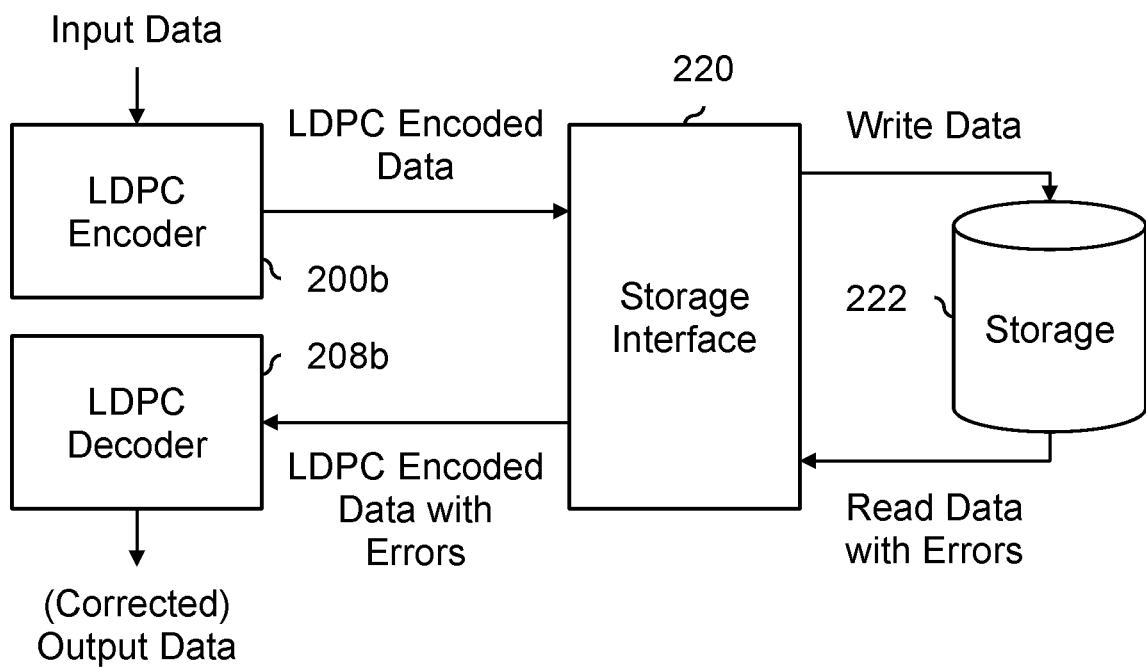
FIG. 2B is a diagram illustrating an embodiment of a low-density parity-check (LDPC) encoder and decoder used in a storage application.

FIG. 2B is a diagram illustrating an embodiment of a low-density parity-check (LDPC) encoder and decoder used in a storage application. In this example, input data to encode is passed to an LDPC encoder (200*b*). The LDPC encoder (200*b*) passes LDPC encoded data to be stored and/or written to storage interface (220) which in turn writes data to storage (222).

To obtain the original data, the storage interface (220) reads back data (with errors) stored on the storage (222) and passes the LDPC encoded data (with errors) to the LDPC decoder (208*b*). The LDPC decoder (208*b*) decodes the LDPC encoded data and outputs the data (e.g., error corrected as or if needed). In some embodiments, LDPC decoder (208*b*) performs an early decoding termination process (e.g., FIG. 1) which permits the LDPC decoding to end earlier than some other LDPC decoders, reducing delay.

Before describing more detailed examples of early decoding termination, it may be helpful to first describe LDPC decoding in more detail. First, an example of min-sum LDPC decoding is described. Then, a layered min-sum LDPC decoding example is described.

Figure 3A:
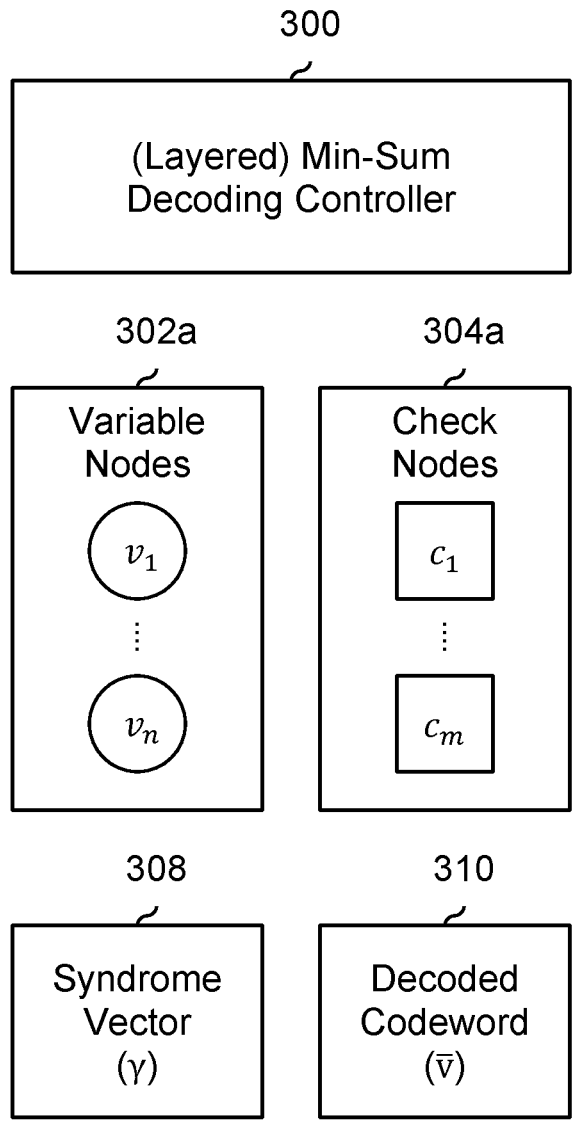
FIG. 3A is a diagram illustrating an example of a min-sum low-density parity-check (LDPC) decoder.

FIG. 3A is a diagram illustrating an example of a min-sum low-density parity-check (LDPC) decoder. Low-density parity-check (LDPC) codes have a very low density of 1's in their parity-check matrix (also referred to herein as an H matrix) used by an LDPC decoder. This makes it convenient to represent an LDPC code using a bipartite graph, called a Tanner Graph. There are two types of nodes in a Tanner graph, namely, variable nodes (302*a*) and check nodes (304*a*). Each variable node (or check node) corresponds to a column (or row) of the parity-check matrix $\overline{H}$. In examples described herein, $V=\{v_1, \ldots, v_n\}$ is the set of variable nodes and $C=\{c_1, \ldots, c_m\}$ is the set of check nodes. Each row of the $\overline{H}$ matrix is indexed by $C=\{1, 2, \ldots, m\}$ and each column of $\overline{H}$ by $V=\{1, 2, \ldots, n\}$. In the Tanner graph, variable node $v_i$ is connected to check node $c_j$ via an edge if $H_{ji}=1$, and the set of edges on the Tanner graph is denoted by set E.

Quasi-cyclic low-density parity-check (QC-LDPC) codes are a special class of the LDPC codes with a structured $\overline{H}$ matrix which can be generated by the expansion of an $m_b \times n_b$ base matrix. Each 1's element in the base matrix can be expanded by a circularly right-shifted b×b identity submatrix. QC-LDPC codes have advantages over other types of LDPC codes in hardware implementations of both encoding and decoding. Encoding of a QC-LDPC code can be efficiently implemented using simple shift registers. In some hardware implementation embodiments of a QC-LDPC decoder, the QC structure of the code simplifies the wire routing for message passing.

In this example, a message-passing (MP) LDPC decoder is shown. In general, the (layered) min-sum decoding controller (300) controls the message passing between the variable nodes (302*a*) and the check nodes (304*a*). Periodically, the controller (300) will check the syndrome vector (308); if the syndrome vector is all-zero then all of the errors have been removed from the LDPC encoded data and the decoded codeword (310) is output. Message passing is the most efficient way to achieve near-optimal decoding of LDPC codes. In message passing decoding, the variable node (VN) and check node (CN) update rules as follows. For brevity and notational conciseness, examples described herein may simply use i (instead of $v_i$) to denote a variable node and j (instead of $c_j$) to denote a check node. A variable node i receives an input message $L_i^{ch}$ from the channel, typically the log-likelihood ratio (LLR) of the corresponding channel output, defined as follows:

$$L_i^{ch} = \log\left(\frac{Pr(R_i = r_i | c_i = 0)}{Pr(R_i = r_i | c_i = 1)}\right), \quad (1)$$

where $c_i \in \{0, 1\}$ is the code bit and $r_i$ is the corresponding received symbol.

An iterative message passing decoder alternates between two phases: a variable node to check node phase during which variable nodes send messages to check nodes along their adjacent edges and a check node to variable node phase during which check nodes send messages to their adjacent variable nodes. The message update rules (which are described in more detail below) are depicted schematically in FIGS. 3B and 3C, respectively.

Figure 3B:
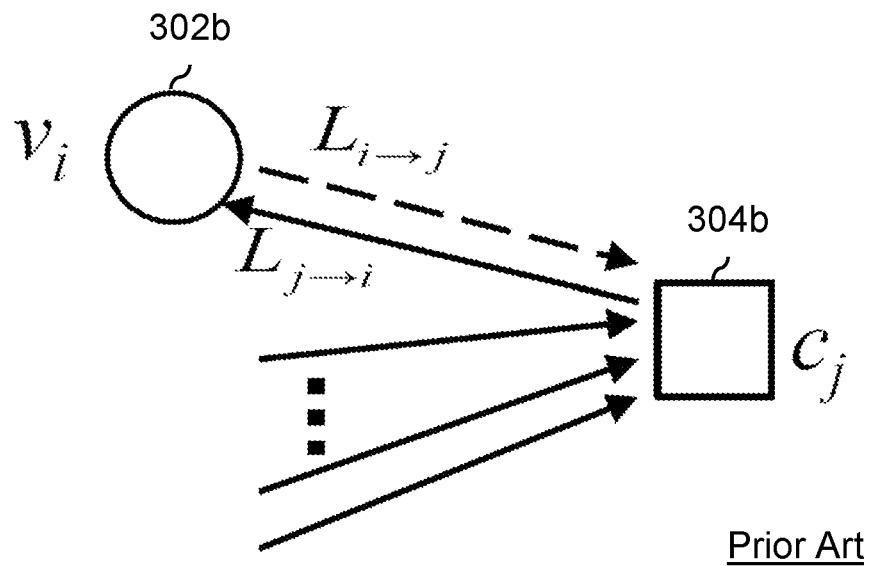
FIG. 3B is a diagram illustrating an example of a check node to variable node message update associated with a variable node to check node phase.

FIG. 3B is a diagram illustrating an example of a check node to variable node message update associated with a variable node to check node phase. In this example, each check node (304b) receives LLR information from all of its neighboring variable nodes (302b). For each such variable node, an updated check-to-variable message is generated using the inputs from all other neighboring variable nodes.

Figure 3C:
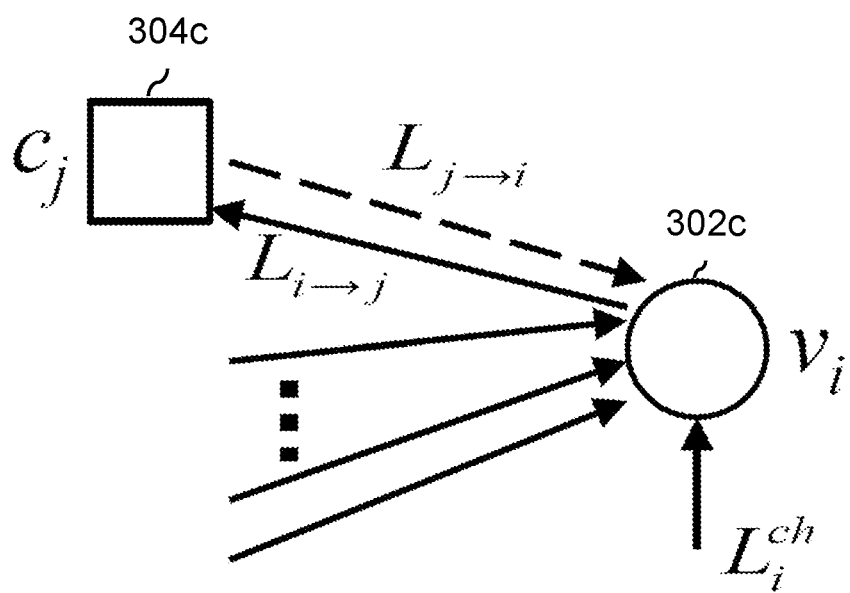
FIG. 3C is a diagram illustrating an example of a variable node to check node message update associated with a check node to variable node phase.

FIG. 3C is a diagram illustrating an example of a variable node to check node message update associated with a check node to variable node phase. In this example, each variable node (302c) receives LLR information from all of its neighboring check nodes (304c). For each such variable node, an updated variable-to-check message is generated using the inputs from all other neighboring check nodes.

In the initialization step of the decoding process, variable node i forwards the same message to all of its neighboring check nodes, (i), namely the LLR $L_i^{ch}$ derived from the corresponding channel output. In the check node-to-variable node message update phase, check node j uses the incoming messages and CN update rule to compute and forward, to variable node $i \in (j)$, a new check node to variable node message, $L_{j \to i}$. Variable node t then processes its incoming messages according to the variable node update rule and forwards to each adjacent check node, (i), an updated variable node to check node message, $L_{i \to j}$. After a pre-specified number of iterations, variable node i sums all of the incoming LLR messages to produce an estimate of the corresponding code bit i. Note that all of the check node to variable node message updates can be done in parallel, as can all of the variable node to check node message updates. This enables efficient, high-speed software and hardware implementations of the iterative message passing decoding.

$L_{i \to j}$ and $L_{j \to i}$ are the messages sent from variable node i to check node j and from check node j to variable node i, respectively. (i) is the set of check nodes directly connected to variable node i and (j) is the set of variable nodes directly connected to check node j. Then, the message sent from variable node i to check node j in SPA decoding is given by:

$$L_{i \to j} = L_i^{ch} + \sum_{j' \in c(i) \setminus j} L_{j' \to i}, \quad (2)$$

and the message from check node j to variable node i is computed as:

$$L_{j \to i} = 2 \tanh^{-1}\left(\prod_{i' \in v(j) \setminus i} \tanh \frac{L_{i' \to j}}{2}\right). \quad (3)$$

$P_i$ is the a posteriori probability (APP) message of variable node i:

$$P_i = L_i^{ch} + \sum_{j' \in c(i)} L_{j' \to i}. \quad (4)$$

The decoded word v is defined as the hard-decision of the APP messages $\overline{P}$, that is:

$$[v_1, v_2, v_3, \ldots, v_{n-1}, v_n] \triangleq hd([P_1, P_2, P_3, \ldots, P_{n-1}, P_n]) \quad (5)$$

where $hd(P_i)$ is 1 if $P_i < 0$, or 0 otherwise. A decoding success is declared if the resulting syndrome vector ($\gamma$) is all zeros, such that:

$$\gamma \triangleq \overline{v} \cdot \overline{H} = \overline{0}. \quad (6)$$

During the decoding process, the decoded word ($\overline{v}$) and the syndrome vector ($\gamma$) are both initialized to all zeros, and incrementally updated upon processing of each variable node. Mathematically, this is represented as:

$$\gamma \leftarrow \gamma \oplus (v_i^{old} \oplus v_i^{new}) \cdot h_i \quad (7)$$

where $v_i^{new} \triangleq hd(P_i)$ is the updated hard decision i-th bit, and $h_i$ denotes the i-th row of the parity check matrix $\overline{H}$.

A popular way to perform min-sum decoding is to have variable nodes take log-likelihood ratios of received information from the channel as an initial input message (i.e., $L_{i \to j} = L_i^{ch}$) and employ the following equivalent check node update rule:

$$L_{j \to i} = \left[\prod_{i' \in v(j) \setminus i} sign(L_{i' \to j})\right] \cdot \left[\alpha \cdot \min_{i' \in v(j) \setminus i} |L_{i' \to j}| + \beta\right], \quad (8)$$

where $0 < \alpha$ and $\beta < 1$ are the attenuation factor and attenuation rounding parameter, respectively, which can be either pre-fixed or dynamically adjusted. These satisfy the requirement that:

$$\alpha + \beta \geq 1 \quad (9)$$

This ensures that a minimum check node to variable node message of 1 is not attenuated to zero.

Channel LLR inputs may be conveniently scaled for min-sum decoding but precise information is needed for the original sum-product decoding. The following notations help to simplify the above calculation in the algorithmic procedure. Let:

$$s_{i \to j} \triangleq hd(L_{i \to j}) \quad (10)$$

be the binary sign representation, which converts to the actual sign value in terms of:

$$sign(s) = (-1)^s.$$

Let $s^{(j)}$ be the total sign of all variable nodes i's to the check nodes j:

$$s^{(j)} \triangleq \oplus_{i' \in v(j)} s_{i' \to j}. \quad (11)$$

Let $L_1^{(j)}$ and $i_{L_1}^{(j)}$ be the minimum variable node message to check node j and its associated index, respectively:

$$L_1^{(j)} \triangleq \min_{i \in v(j)} |L_{i' \to j}|, \ i_{L_1}^{(j)} \triangleq \arg\min_{i \to \in v(j)} |L_{i' \to j}| \quad (12)$$

and let $L_2^{(j)}$ be the second minimum (e.g., second lowest) variable node message to check node j:

$$L_2^{(j)} \triangleq \min_{i' \in v(j) \setminus i_{L_1}^{(j)}} |L_{i' \to j}|. \quad (13)$$

Let $\hat{L}_1^{(j)}$ and $\hat{L}_2^{(j)}$ be the attenuated minimum and second minimum variable node messages to check node j, that is:

$$\hat{L}_1^{(j)} \triangleq \lfloor \alpha \cdot L_1^{(j)} + \beta \rfloor, \ \hat{L}_2^{(j)} \triangleq \lfloor \alpha \cdot L_2^{(j)} + \beta \rfloor \quad (14)$$

and therefore with the above notations, Equation (8) is conveniently re-expressed by:

$$L_{j \to i} = s^{(j)} \cdot s_{i \to j} \cdot \begin{cases} \hat{L}_1^{(j)}, \text{if } i \neq i_{L_1}^{(j)} \\ \hat{L}_2^{(j)}, \text{if } i = i_{L_1}^{(j)} \end{cases} \quad (15)$$

A decoding success is declared if the all-zero syndrome results after the first full iteration.

When a QC-LDPC code with b×b circulants is in use, each circulant of b bits is updated independently and in parallel.

In hardware implementations of iterative message passing LDPC decoding, the decoding efficiency of min-sum decoding can be further improved using a layered approach. Layered min-sum decoding is based on a serial (e.g., sequential, ordered, etc.) update of check node messages. Instead of sending all messages from variable nodes to check nodes, and then all messages from check nodes to variable nodes, the layered coding goes over the check nodes in (some) sequential order such that, to each updating check node, all messages are sent in and processed, and then sent out to neighboring variable nodes. Such scheduled and/or serial updates to the check nodes enable immediate propagation of the newly updated message, unlike the flooded scheme where the updated messages can propagate only at the next iteration. To put it another way, the flooding approach is not amenable to stopping or pausing or decoding between decoding iterations and outputting the decoded codeword at that time whereas the scheduled and/or serial approach of layered decoding does permit or otherwise allow for this.

The layered min-sum decoding approach roughly increases convergence speed by two times compared to the flooded min-sum decoding approach. Moreover, it provides a good trade-off between speed and memory. This is achieved by iterating over dynamic check node to variable node messages, denoted by $\bar{Q} \triangleq [Q_1, Q_2, \ldots, Q_n]$. Specifically, let variable node $i \in V(j)$ and so $Q_i$ over a layer j is defined as:

$$Q_i^{(j)} \triangleq L_{j \to i} = L_i^{ch} + \sum_{j' \in c(i) \setminus j} L_{j' \to i}^{(last)}, \quad (16)$$

where the superscript $^{(last)}$ denotes a latest updated piece of data. It is noted that in layered min-sum decoding, the variable node to check node message updated at the last layer (all but the last are from the current iteration) is utilized to update the check node to variable node $Q_i$ in the current layer. In contrast, in flooded decoding updating, a check node to variable node message $L_{j \to i}$ utilizes the variable node to check node messages each generated at the last iteration. $\bar{Q} \triangleq [Q_1, Q_2, \ldots, Q_n]$ memory is initialized with the channel messages $\bar{L}^{ch} \triangleq [L_1^{ch}, L_2^{ch}, \ldots, L_n^{ch}]$ and no dedicated memory is needed to store $\bar{L}^{ch}$, whereas with the flooded approach $\bar{L}^{ch}$ is stored but not $\bar{Q}$. $Q_i$, i=1, 2, . . . , n is iteratively calculated as follows. Let j be the current layer and $j_i$ be the preceding layer associated with variable node i. A preceding layer is declared or otherwise defined (e.g., mathematically) as follows. Let $j_1 < j_2 < \ldots < j_k$ be all check nodes directly connected to variable node i, then $j_l$ (subscript letter l) is the preceding layer of $j_{l+1}$ (subscript letter l plus number 1) for l=1, 2, . . . , k−1, and $j_k$ is the preceding layer of $j_1$ (subscript number 1).

The APP message $P_i$ at the layer j is calculated as:

$$P_i^{(j)} = Q_i^{(j)} + L_{j \to i}^{new}, \quad (17)$$

where $L_{j \to i}^{new}$ (subscript j_sub_letter_i right arrow letter i) is newly updated and $Q_i$ is iteratively updated by:

$$Q_i^{(j)} = P_i^{(j)} - L_{j \to i}^{old}, \quad (18)$$

where $L_{j \to i}^{old}$ was saved during the preceding iteration. The layered decoding can be applied to all types of iterative message passing decoding, including the sum-product algorithm (SPA) and min-sum decoding. A hardware amenable layered min-sum decoding process without early convergence is described in FIG. 4.

FIG. 4 is a diagram illustrating an example of a layered min-sum decoding process without early convergence. In this example, the process begins by initializing the data (400). In lines 1-8 (402), the process then goes through a first iteration of layered message passing and generates a decoded codeword ($\bar{v}$) and syndrome ($\gamma$).

Line 9 (404) is the first opportunity for a (successfully) decoded codeword to be output. As shown in line 9, the decoding process must be beyond the first iteration. This means that the first opportunity for the decoded codeword to be output in this older and slower technique is right after the first iteration when: KITHP036C1=0 (see, e.g., the for loop at line 1), j=0 (see, e.g., the for loop at line 2), and i=0 (see, e.g., the for loop at line 4).

Note the exemplary decoding process shown in FIG. 4 treats each check node as a layer, such that J has single element. When a QC-LDPC code with b×b circulants is used, b check nodes within a circulant are treated as a layer, each being processed independently and in parallel. In this QC-LDPC scenario, line 1 (406) of the process shown in FIG. 4 would instead be:

1. for $\mathcal{J} = \{t \cdot b + a\}_{a=0}^{b-1}, t = 0, 1, 2, \ldots, \frac{m}{b} - 1$, do.

To put it another way, J is a set iterating through indexes 0, 1, 2, . . . , $$\frac{m}{b} - 1,$$

such that $J_a = \{ab, ab+1, ab+2, \ldots, ab+b-1\}$.

Returning to the convergence check at the end of the first iteration at line 9 (404), the rationale behind this is based on the initialized values (400). Note that the decoded word ($\bar{v}$) and syndrome ($\gamma$) are both initialized to all zeros. As a result, a false convergence (false positive) would occur if the syndrome were checked for all zeros (e.g., check if the syndrome vector indicates that decoding successful and all errors have been removed) at the beginning of an iteration. In contrast, at the end of decoding (e.g., at the end of the first full decoding iteration), all variable bits are updated by the decoder, thus truly reflecting a decoded word. Therefore, it is safe to check for convergence after the first iteration and to terminate the decoder when the syndrome is all zeros.

Although checking the syndrome at the end of the first full iteration (as shown in FIG. 4) is a safe choice that ensures no false positives, with layered decoding it is possible to check the syndrome earlier than that while still ensuring that no false positives will occur. For example, note that the column weight of all practical LDPC parity check matrices H is at least 2 (i.e., w≥2). As a result, each variable bit is processed at least 2 times by the layered decoder in single iteration. In some cases (e.g., when there are only a few errors), a single pass by the decoder is sufficient to remove all errors and the second pass in that iteration (e.g., dictated by an exemplary column weight of 2) is not necessary. In other words, in some cases, it may only take a fraction of an iteration to successfully process all variable bits. Therefore, in some embodiments with early convergence, the number of unprocessed variable bits (e.g., the bits that are output by the variable nodes) is tracked and a syndrome check is performed as soon as the count reaches zero. The following figures show an example of this.

Figure 5:
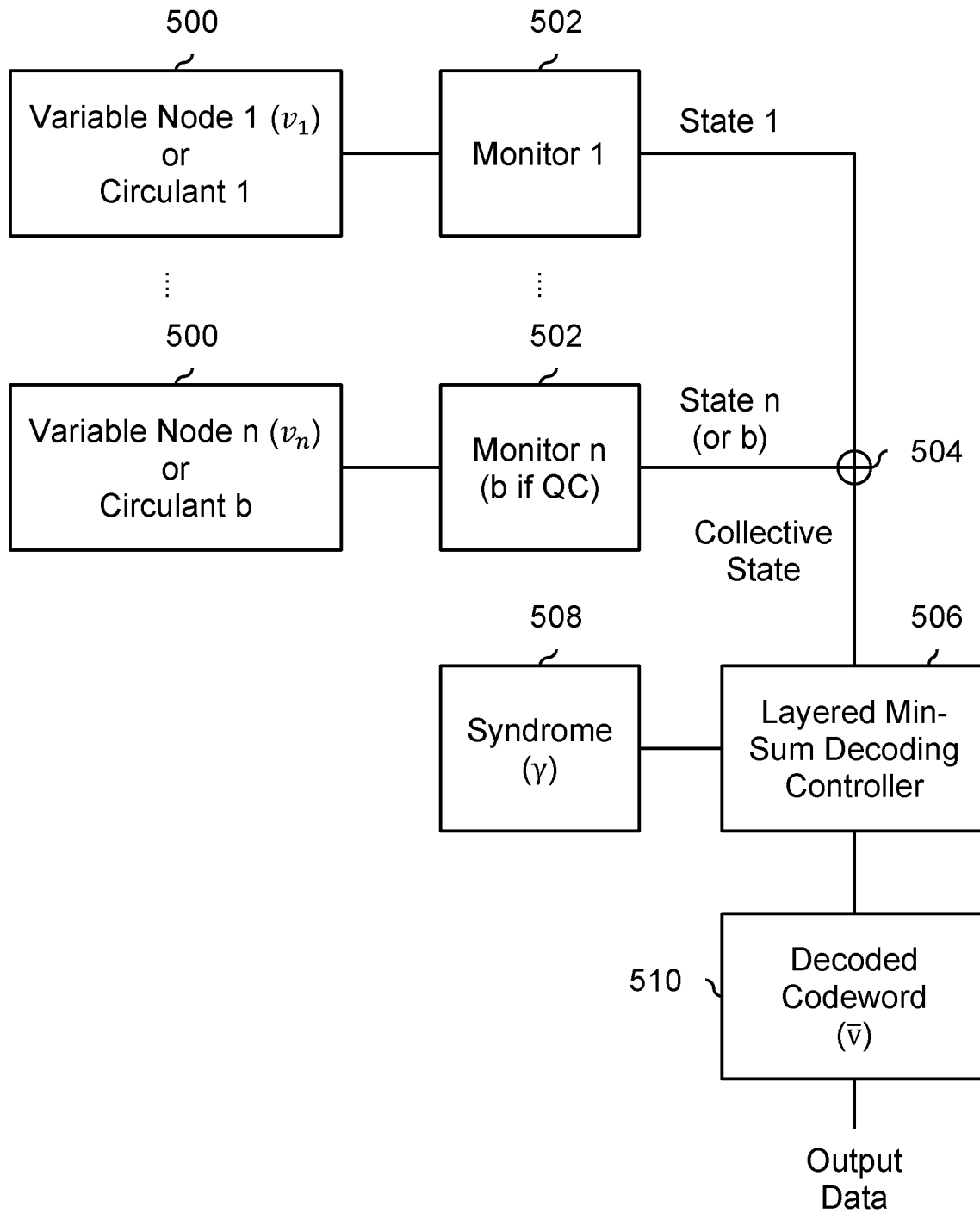
FIG. 5 is a diagram illustrating an embodiment of a layered min-sum low-density parity-check (LDPC) decoder that monitors states to determine when an early convergence checkpoint has occurred.

FIG. 5 is a diagram illustrating an embodiment of a layered min-sum low-density parity-check (LDPC) decoder that monitors states to determine when an early convergence checkpoint has occurred. To preserve the readability of the diagram, some elements that are not relevant to the technique (e.g., check nodes) are not shown.

In a non-QC-LDPC example, there are n variable nodes (500) that output a plurality of variable bits. n monitoring blocks (502) each input a corresponding variable bit and determine when that variable bit (variable node) has been (e.g., sufficiently) processed so that if a check of the syndromes were performed, a false positive would not result. For example, if a state signal output by a monitor (502) is a value of 1 (as an example), that means that the corresponding variable node or variable bit has had at least some LDPC decoding performed on it (e.g., so a syndrome which is generated from that variable node or variable bit can be trusted), whereas a 0 means that the corresponding variable bit has not yet been (e.g., sufficiently) processed. The monitoring blocks are illustrative and/or exemplary to convey the concept and in some embodiments are not necessary because there is already a signal within the system that can be reused or otherwise repurposed as the state signal.

The state signals generated by the monitoring blocks (402) are input to an AND block (504) to generate a collective state signal. The collective state signal is a 1 when all of the variable bits have been processed (e.g., indicated by the state signals all being 1).

The collective state signal is input by a layered min-sum decoding controller (506). When the collective state signal goes from a 0 to a 1, LDPC decoding is paused (e.g., message passing is paused) while the controller (506) checks the syndrome (508) to see if the syndrome is all zeros. If the syndrome (508) is all zeros, then the controller (506) outputs the decoded codeword (510) as the output data.

In some embodiments, a QC-LDPC code is used. In such embodiments, the H matrix is a quasi-cyclic H̄ matrix where all bits within a circulant are processed in parallel. Therefore, in QC-LDPC embodiments, it is sufficient to track the number of unprocessed circulants. As shown herein, in a QC-LDPC example, the monitoring blocks (502) track the state of the circulants (500) instead of variable nodes. It is noted that there are (up to) circulants (as opposed to n variable nodes in the non-QC-LDPC example), so the number of monitoring blocks (502) is adjusted accordingly so that there are b monitoring blocks.

The following figures describe this more formally and/or generally in a flowchart.

Figure 6A:
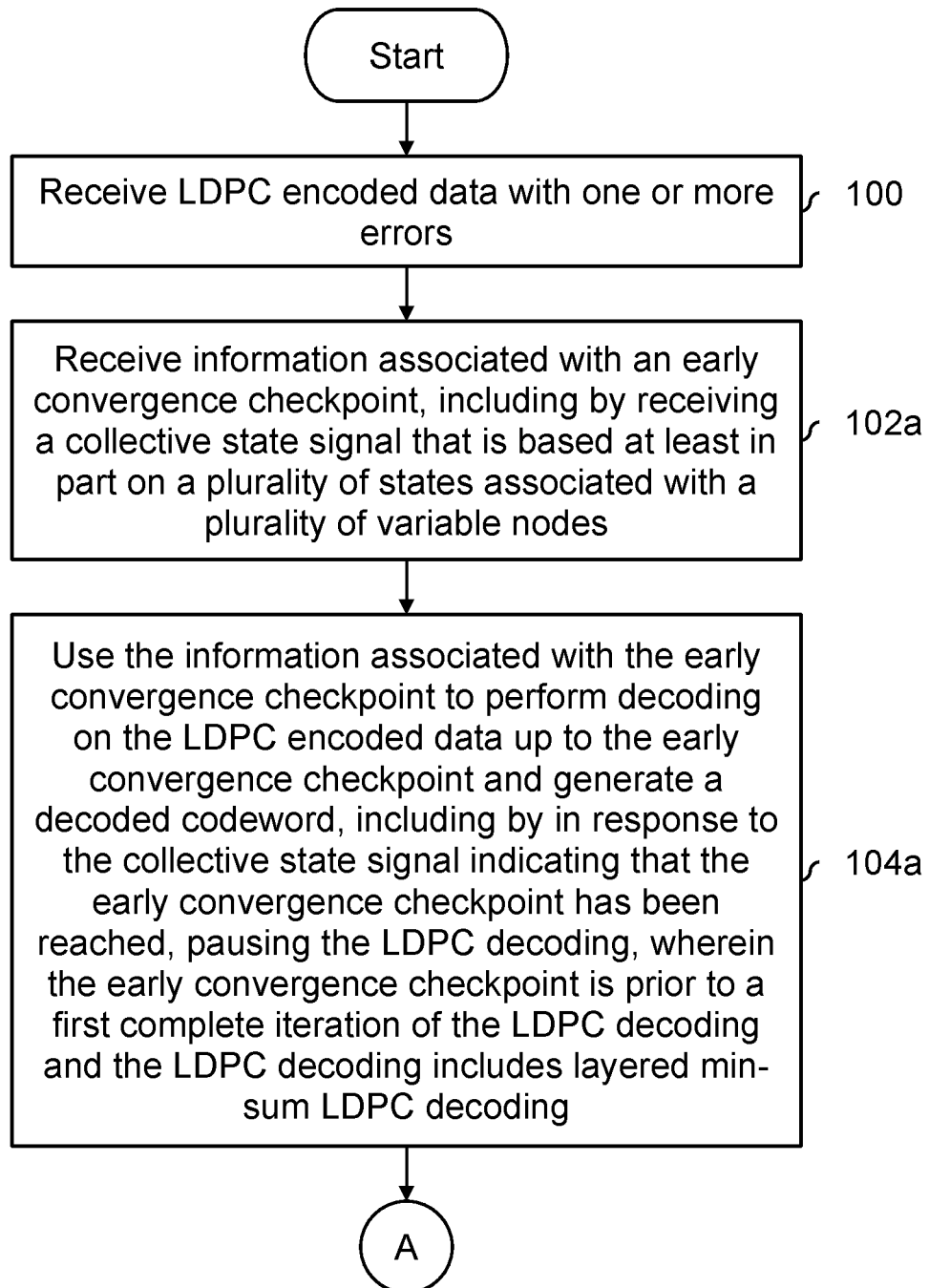
FIG. 6A is a flowchart illustrating an embodiment of a low-density parity-check (LDPC) decoding process with early convergence that monitors check node states to determine when an early convergence checkpoint has occurred.

FIG. 6A is a flowchart illustrating an embodiment of a low-density parity-check (LDPC) decoding process with early convergence that monitors check node states to determine when an early convergence checkpoint has occurred. FIG. 6A is related to FIG. 1 and for convenience the same or similar reference numbers are used to indicate related steps.

At 100, LDPC encoded data with one or more errors is received.

At 102a, information associated with an early convergence checkpoint is received, including by receiving a collective state signal that is based at least in part on a plurality of states associated with a plurality of variable nodes. For example, in FIG. 5, the collective state signal is output by the AND block (504) based on the state signals from the monitoring blocks (502).

At 104a, the information associated with the early convergence checkpoint is used to perform decoding on the LDPC encoded data up to the early convergence checkpoint and generate a decoded codeword, wherein the early convergence checkpoint is prior to a first complete iteration of the layered min-sum LDPC decoding; and in response to the collective state signal indicating that the early convergence checkpoint has been reached, pausing the LDPC decoding, wherein the LDPC decoding includes layered min-sum LDPC decoding. For example, the controller (506) in FIG. 5 may stop message passing between the variable nodes (500) and check nodes in response to assertion of the collective state signal so that the controller can check the syndrome (508).

The process then continues to step 106 in FIG. 1 and proceeds as described above.

Figure 6B:
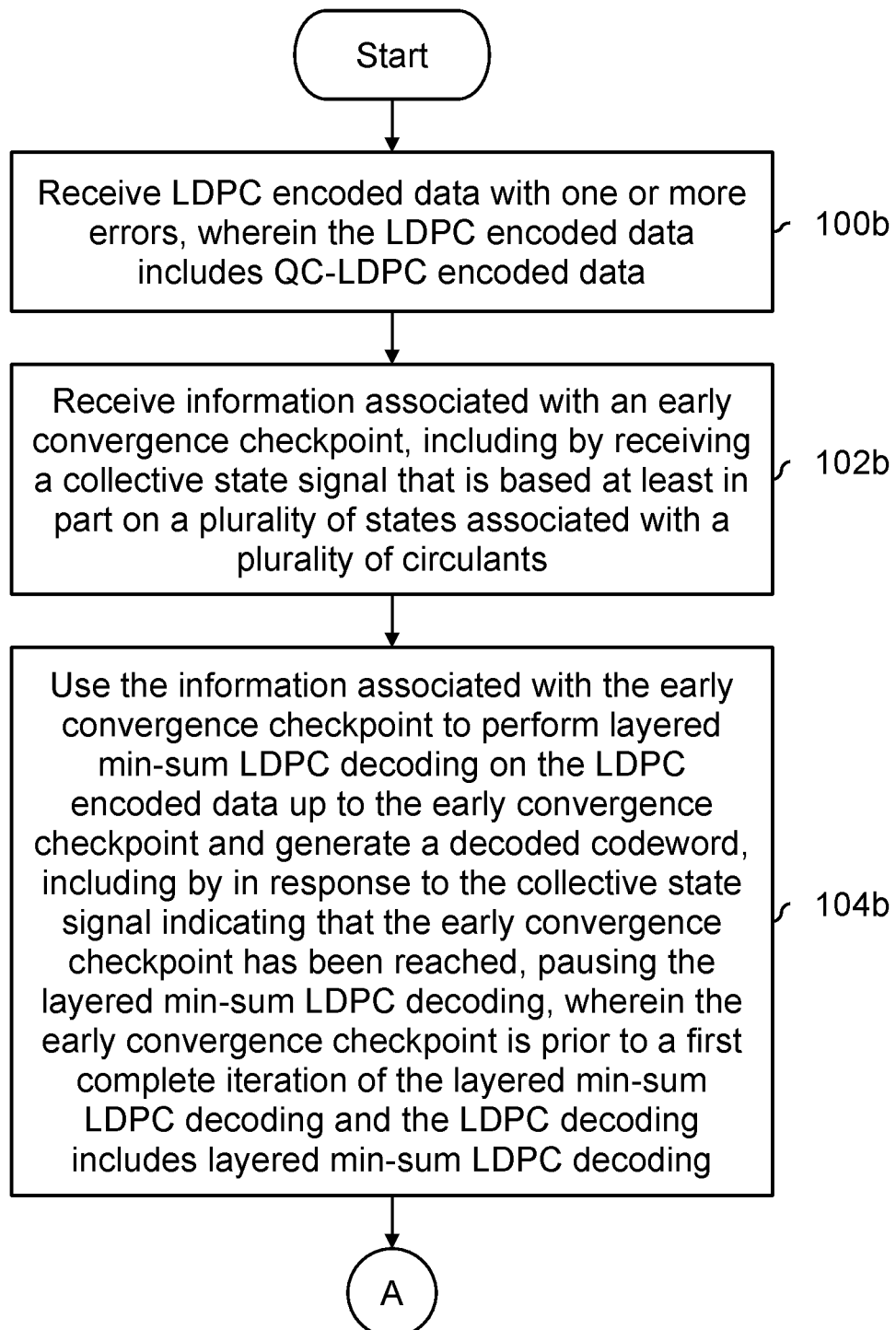
FIG. 6B is a flowchart illustrating an embodiment of a low-density parity-check (LDPC) decoding process with early convergence that monitors circulant states to determine when an early convergence checkpoint has occurred.

FIG. 6B is a flowchart illustrating an embodiment of a low-density parity-check (LDPC) decoding process with early convergence that monitors circulant states to determine when an early convergence checkpoint has occurred. FIG. 6B is related to FIG. 1 and for convenience the same or similar reference numbers are used to indicate related steps.

At 100b, LDPC encoded data with one or more errors is received, wherein the LDPC encoded data includes QC-LDPC encoded data.

At 102b, information associated with an early convergence checkpoint is received, including by receiving a collective state signal that is based at least in part on a plurality of states associated with a plurality of circulants. As described above, with QC-LDPC codes, it is sufficient to monitor the circulants. This is more efficient (for QC-LDPC embodiments) than monitoring all of the variable nodes (as an example) since there are fewer circulants than variable nodes and so less monitoring logic and/or routing is used when circulants are monitored.

At 104b, the information associated with the early convergence checkpoint is used to perform layered min-sum LDPC decoding on the LDPC encoded data up to the early convergence checkpoint and generate a decoded codeword, including by in response to the collective state signal indicating that the early convergence checkpoint has been reached, pausing the layered min-sum LDPC decoding, wherein the early convergence checkpoint is prior to a first complete iteration of the layered min-sum LDPC decoding and the LDPC decoding includes layered min-sum LDPC decoding.

The process then continues to step 106 in FIG. 1 and proceeds as described above.

Depending upon the implementation and/or application, a different embodiment for determining when the early convergence checkpoint has occurred may be desirable. For example, suppose that due to the specific implementation of a layered min-sum decoder, the variable nodes or circulants are spread out. Monitoring (some examples of which are described in FIGS. 5-6B) may therefore consume more routing area than is desirable for some applications. Or (again due to the specific implementation), the size of monitoring blocks (e.g., 502 in FIG. 5) may be larger than is desirable for some applications. For these reasons, it may be desirable to have other approaches for determining when the early convergence checkpoint has occurred. The following examples describe (pre-)calculating a fractional iteration count where a layered min-sum decoding controller stops when the current fractional iteration count reaches the target fractional iteration count.

With layered min-sum decoding, the sequence in which decoding is performed in the various layers (e.g., the ordering and/or timing when variable bits (circulants for QC-LDPC parallel processing) are processed within the first layer, the second layer, etc.) is known ahead of time. This known sequencing or ordering permits the exact layer number (denoted by $\tau$) along with the associated variable index (circulant index for QC-LDPC parallel processing) (denoted by $\tau'$) that corresponds to zero unprocessed variable bits (circulants for QC-LDPC parallel processing) which in turn permit a fractional iteration count (denoted by $\eta$) to be calculated or otherwise determined as:

$$\eta \triangleq \frac{\tau}{m} + \frac{\tau'}{m \cdot \omega_\tau} \quad (19)$$

where m is the number of layers of $\overline{H}$ (or m/b in the case of QC parallel processing), and $\omega_r$ denotes the weight of the r-th layer. The layered min-sum decoder would then track the fractional iteration and when the current fractional iteration count exceeds the fractional iteration count $\eta$, decoding would be paused (e.g., at the next convenient point, such as at the end of the next layer).

The following figures show a visual example of this calculation using a QC-LDPC example.

FIG. 7A is a diagram illustrating an embodiment of QC-LDPC circulants in an $\overline{H}$ matrix that are processed during a first layer. In this example, the H matrix (700a) gives the layered decoding schedule in which circulants (represented by shifted identity matrices $I_0, I_1, I_2, \ldots, I_{47}$) are iteratively processed in sequential order. In this example, the $\overline{H}$ matrix (700a) has 6 layers (note, for example, the 6 rows in the $\overline{H}$ matrix) and a constant weight of 3 (e.g., each layer or row is processed three times).

During the first layer (702), shifted identity matrices $I_0$-$I_6$ are processed. Columns with a non-zero value (i.e., a circulant) that are processed during the first iteration are indicated using a check mark above those columns.

FIG. 7B is a diagram illustrating an embodiment of QC-LDPC circulants in an $\overline{H}$ matrix that are processed during a second layer. During the second layer (710), the shifted identity matrices $I_7$-$I_{14}$ in the $\overline{H}$ matrix (700b) are processed. Check marks have been added above those columns that contain those shifted identity matrices processed in the second layer (i.e., the check marks shown are cumulative).

FIG. 7C is a diagram illustrating an embodiment of QC-LDPC circulants in an $\overline{H}$ matrix that are processed during a third layer. During the third layer (720), shifted identity matrices $I_{15}$-$I_{22}$ in the $\overline{H}$ matrix (700c) are processed. Prior to the end of the third layer (e.g., going from left to right), $I_{20}$ (722) is the circulant at which all of the columns have been processed at least once with a non-zero value and/or circulant. Note, for example, that there is a check mark above each column when the processing sequence reaches $I_{20}$ (722).

Once all of the columns in the $\overline{H}$ matrix have been processed at least once with a non-zero value, this corresponds to a state in which there are zero unprocessed circulants (or variant bits) and it is therefore safe to check the syndromes to see if the decoding process can stop because all of the errors have been removed. In other words, $I_{20}$ (722) corresponds to the early convergence checkpoint at which a check of the decoder can safely be performed without worry about false positives.

Returning to Equation (19), the fractional iteration count ($\eta$) would be calculated using the QC-LDPC version of Equation (19) as $$\eta_{QC} \triangleq \frac{\tau}{\frac{m}{b}} + \frac{1}{\frac{m}{b}} \cdot \frac{\tau'}{\omega_\tau} = \frac{2}{6} + \frac{1}{6} \cdot \frac{5}{8} = \frac{7}{16},$$

wherein $\omega_r$ denotes the Hamming weight of the $\tau$-th layer, and $\tau'$ denotes the threshold index of the last unprocessed circulant. Conceptually, the first term in the sum represents the number of complete or full layers to reach $I_{20}$ (722), in this case the first layer (702) in FIG. 7A and the second layer (710) in FIG. 7B out of 6 layers total. The second term in the sum represents the partial or fractional portion of the last layer to reach $I_{20}$ (722), in this case the number of columns in the third row (720) to reach $I_{20}$ (722) going from left to right in FIG. 7C.

As a practical matter, it may be difficult to pause decoding in the middle of a layer. For example, in FIG. 7C, it may be difficult or impossible in some implementations to pause processing exactly after $I_{20}$ (722) and it may be more practical or feasible to pause processing at the end of the third layer (720). Accordingly, a simpler and/or more hardware convenient fractional iteration count ($\eta_{simplified}$) may be calculated as follows:

$$\eta_{simplified,QC} \triangleq \frac{\tau}{\frac{m}{b}} \quad (20)$$

where the equation is given for non-QC-LDPC codes. Conceptually, in the context of the $\overline{H}$ matrix (700c) shown in FIG. 7C, $\eta_{simplified}$ is the number of full layers or rows to reach $I_{21}$ (722) plus one for the last (e.g., partial) layer or row that contains $I_{21}$ (722), divided by the total number of layers or rows $$\left(\text{i.e., } \eta_{simplified,QC} \triangleq \frac{\tau}{\frac{m}{b}} = \frac{2}{6} = \frac{1}{3}\right).$$

Another way to describe this is to say that it's not worth the effort of precisely calculating the second term in Equation (19) for those embodiments where the decoder cannot easily or feasibly stop in the middle of a layer or row, so the second term in Equation (19) is "rounded up" to the equivalent of a full layer or row.

Returning briefly to the decoding example shown in FIG. 4, with the above technique, line 9 (404) would be replaced with: "If the syndrome γ=0 and the fractional iteration number >η (any appropriate variety), then return the decoded codeword v." However, unlike the example of FIG. 4, the process described herein does not need to finish a complete or entire iteration before checking if all of the errors have been removed.

The following figure describes these examples more formally and/or generally in a flowchart.

Figure 8:
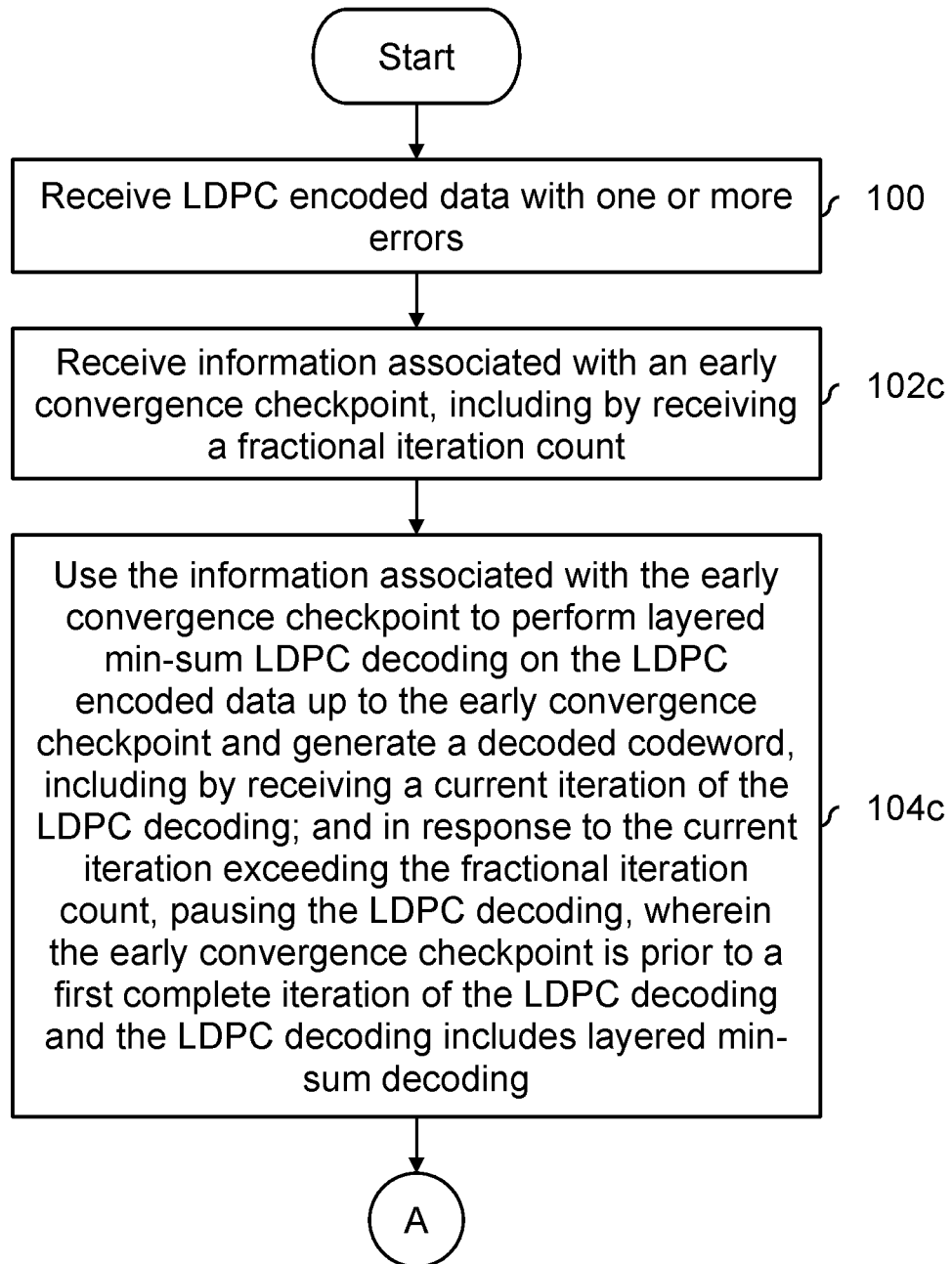
FIG. 8 is a flowchart illustrating an embodiment of a low-density parity-check (LDPC) decoding process with early convergence that uses a fractional iteration count.

FIG. 8 is a flowchart illustrating an embodiment of a low-density parity-check (LDPC) decoding process with early convergence that uses a fractional iteration count. FIG. 8 is related to FIG. 1 and for convenience the same or similar reference numbers are used to indicate related steps.

At 100, LDPC encoded data with one or more errors is received. In some embodiments, the LDPC encoded data is QC-LDPC encoded data.

At 102c, information associated with an early convergence checkpoint is received, including by receiving a fractional iteration count. For example, the fractional iteration count (η) may be calculated per Equation (19) or the fractional iteration count ($\eta_{simplified}$) may be calculated per Equation (20).

At 104c, the information associated with the early convergence checkpoint is used to perform layered min-sum LDPC decoding on the LDPC encoded data up to the early convergence checkpoint and generate a decoded codeword, including by receiving a current iteration of the LDPC decoding; and in response to the current iteration exceeding the fractional iteration count, pausing the LDPC decoding, wherein the early convergence checkpoint is prior to a first complete iteration of the LDPC decoding and the LDPC decoding includes layered min-sum decoding.

As described above, in some cases there may be certain points at which it is easier or more convenient to pause decoding (e.g., at the end of a layer) and in some embodiments, the decoding is paused there.

The process then continues to step 106 in FIG. 1 and proceeds as described above.

Returning briefly to FIGS. 7A-7C, it is noted that the H matrix can be pre-permuted on rows or columns (e.g., to optimize certain hardware design metrics, such as minimize η), while still retaining the code characteristics. The following figure shows an alternate form of the $\bar{H}$ matrices shown in FIGS. 7A-7C.

FIG. 9 is a diagram illustrating an embodiment of a permuted $\bar{H}$ matrix. In this example, the $\bar{H}_{per}$ matrix (900) is a permutation of the $\bar{H}$ matrix (700a-700c) shown in FIGS. 7A-7C. This matrix permutation or manipulation still maintains the code characteristics.

With the permutation shown in $\bar{H}_{per}$ matrix (900), the decoder performs processing up to $I_{22}$ (902) to ensure that all of the circulants (or variable bits) have been processed so that it is safe to check the syndromes. In this example, $I_{22}$ (902) is located in the second row or layer and so the decoder would be "on" for a shorter duration before the early convergence checkpoint in this example compared to the example of FIGS. 7A-7C. In other words, permuted or alternate forms of the $\bar{H}$ matrix (i.e., associated with different sequences or orderings) but which still have the appropriate code characteristics may be explored in order to minimize the amount of time before the early convergence checkpoint occurs.

The following figure describes these examples more formally and/or generally in a flowchart.

Figure 10:
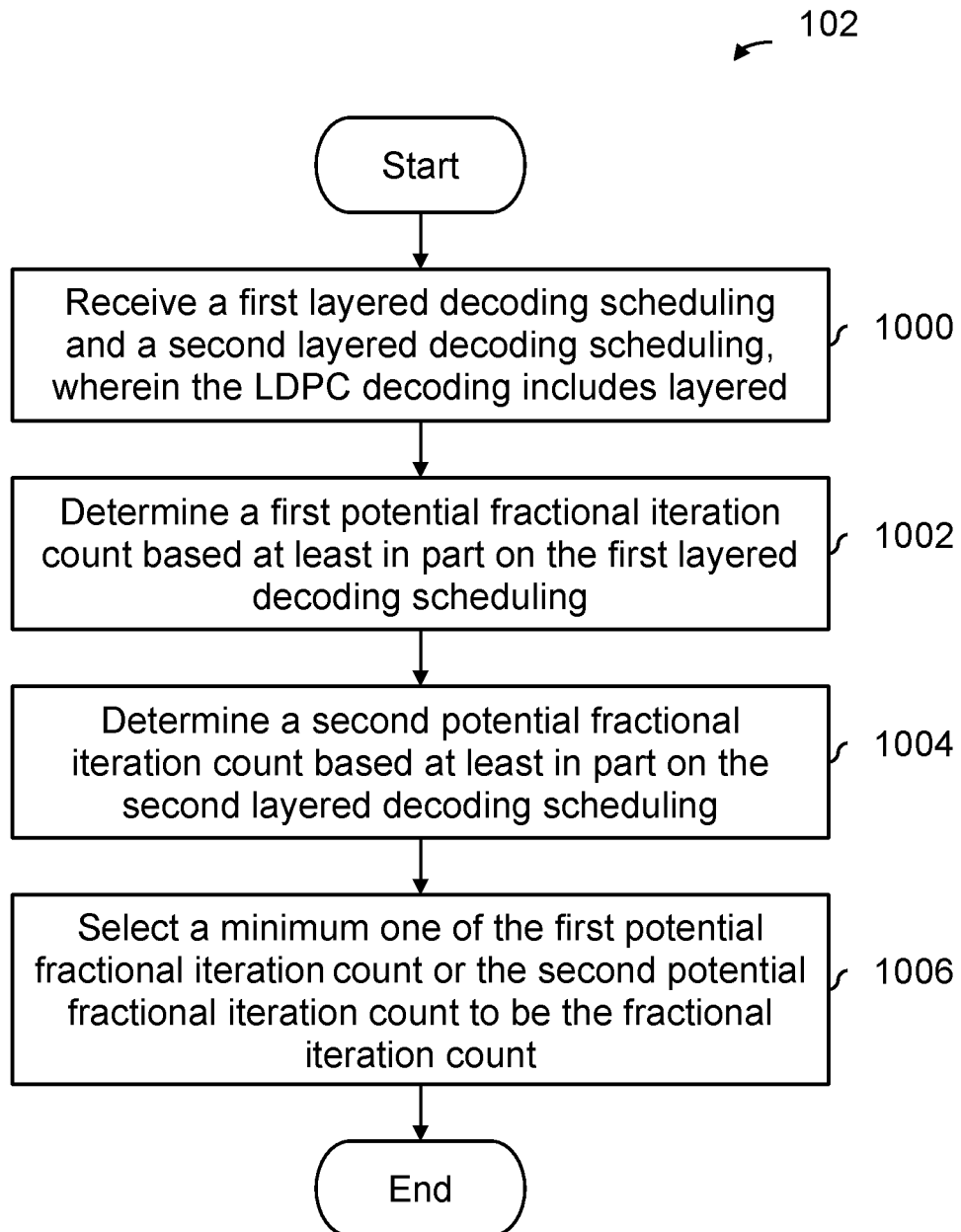
FIG. 10 is a flowchart illustrating an embodiment of a process to determine a minimal fractional iteration count.

FIG. 10 is a flowchart illustrating an embodiment of a process to determine a minimal fractional iteration count. In some embodiments, this process is used to determine a fractional iteration count that is received as (part of) the information associated with an early convergence checkpoint at step 102 in FIG. 1.

At 1000, a first layered decoding scheduling and a second layered decoding scheduling are received. As used herein, layered decoding scheduling refers to the schedule by which (e.g., a particular implementation of) layered min-sum decoding is performed. For example, the $\hat{H}$ matrices (700a-700c) in FIGS. 7A-7C show one layered decoding scheduling and the $\hat{H}_{alt}$ matrix (900) in FIG. 9 shows another layered decoding scheduling.

At 1002, a first potential fractional iteration count is determined based at least in part on the first layered decoding scheduling. At 1004, a second potential fractional iteration count is determined based at least in part on the second layered decoding scheduling. See, for example, Equations (19) and (20) and the example described in FIGS. 7A-7C. Although this example only describes two schedules and two potential fractional iteration counts, any number may be input and generated, respectively.

At 1006, a minimum one of the first potential fractional iteration count or the second potential fractional iteration count is selected to be the fractional iteration count. For example, a lower fractional iteration count permits the early convergence checkpoint to be reached sooner so that more power and/or processing resources can be conserved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a memory; and
a processor coupled to the memory and configured to:
receive low-density parity-check (LDPC) encoded data with one or more errors;
receive information associated with an early convergence checkpoint, wherein the information associated with the early convergence checkpoint is determined, including by:
receiving a first layered decoding scheduling and a second layered decoding scheduling, wherein the LDPC decoding includes layered min-sum decoding;
determining a first potential fractional iteration count based at least in part on the first layered decoding scheduling;
determining a second potential fractional iteration count based at least in part on the second layered decoding scheduling; and
selecting a minimum one of the first potential fractional iteration count or the second potential fractional iteration count to be a fractional iteration count;
use the information associated with the early convergence checkpoint to perform LDPC decoding on the LDPC encoded data up to the early convergence checkpoint and generate a decoded codeword, wherein the early convergence checkpoint is prior to a first complete iteration of the LDPC decoding;

determine whether the LDPC decoding is successful; and in the event it is determined that the LDPC decoding is successful, output the decoded codeword.

2. The system of claim 1, wherein using the information associated with the early convergence checkpoint includes using one or more of the following: layered min-sum LDPC decoding or sum-product algorithm (SPA) LDPC decoding.

3. The system of claim 1, wherein the LDPC encoded data is received via a communication channel.

4. The system of claim 1, wherein the LDPC encoded data is received via a storage system.

5. The system of claim 1, wherein:
receiving the information associated with the early convergence checkpoint includes receiving a collective state signal that is based at least in part on a plurality of states associated with a plurality of variable nodes; and
using the information associated with the early convergence checkpoint includes in response to the collective state signal indicating that the early convergence checkpoint has been reached, pausing the LDPC decoding, wherein the LDPC decoding includes layered min-sum LDPC decoding.

6. The system of claim 1, wherein:
the LDPC encoded data includes QC-LDPC encoded data;
receiving the information associated with the early convergence checkpoint includes receiving a collective state signal that is based at least in part on a plurality of states associated with a plurality of circulants; and
using the information associated with the early convergence checkpoint includes in response to the collective state signal indicating that the early convergence checkpoint has been reached, pausing the LDPC decoding, wherein the LDPC decoding includes layered min-sum LDPC decoding.

7. The system of claim 1, wherein:
receiving the information associated with the early convergence checkpoint includes receiving the fractional iteration count; and
using the information associated with the early convergence checkpoint includes:
receiving a current iteration of the LDPC decoding; and
in response to the current iteration exceeding the fractional iteration count, pausing the LDPC decoding, wherein the LDPC decoding includes layered min-sum decoding.

8. A method, comprising:
receiving low-density parity-check (LDPC) encoded data with one or more errors;
receiving information associated with an early convergence checkpoint, wherein the information associated with the early convergence checkpoint is determined, including by:
receiving a first layered decoding scheduling and a second layered decoding scheduling, wherein the LDPC decoding includes layered min-sum decoding;
determining a first potential fractional iteration count based at least in part on the first layered decoding scheduling;
determining a second potential fractional iteration count based at least in part on the second layered decoding scheduling; and
selecting a minimum one of the first potential fractional iteration count or the second potential fractional iteration count to be a fractional iteration count;

using the information associated with the early convergence checkpoint to perform LDPC decoding on the LDPC encoded data up to the early convergence checkpoint and generate a decoded codeword, wherein the early convergence checkpoint is prior to a first complete iteration of the LDPC decoding;

determining whether the LDPC decoding is successful; and in the event it is determined that the LDPC decoding is successful, outputting the decoded codeword.

9. The method of claim 8, wherein using the information associated with the early convergence checkpoint includes using one or more of the following: layered min-sum LDPC decoding or sum-product algorithm (SPA) LDPC decoding.

10. The method of claim 8, wherein the LDPC encoded data is received via a communication channel.

11. The method of claim 8, wherein the LDPC encoded data is received via a storage system.

12. The method of claim 8, wherein:
receiving the information associated with the early convergence checkpoint includes receiving a collective state signal that is based at least in part on a plurality of states associated with a plurality of variable nodes; and
using the information associated with the early convergence checkpoint includes in response to the collective state signal indicating that the early convergence checkpoint has been reached, pausing the LDPC decoding, wherein the LDPC decoding includes layered min-sum LDPC decoding.

13. The method of claim 8, wherein:
the LDPC encoded data includes QC-LDPC encoded data;
receiving the information associated with the early convergence checkpoint includes receiving a collective state signal that is based at least in part on a plurality of states associated with a plurality of circulants; and
using the information associated with the early convergence checkpoint includes in response to the collective state signal indicating that the early convergence checkpoint has been reached, pausing the LDPC decoding, wherein the LDPC decoding includes layered min-sum LDPC decoding.

14. The method of claim 8, wherein:
receiving the information associated with the early convergence checkpoint includes receiving the fractional iteration count; and
using the information associated with the early convergence checkpoint includes:
receiving a current iteration of the LDPC decoding; and
in response to the current iteration exceeding the fractional iteration count, pausing the LDPC decoding, wherein the LDPC decoding includes layered min-sum decoding.

15. A computer program product embodied in a non-transitory computer readable medium and comprising computer instructions for:
receiving low-density parity-check (LDPC) encoded data with one or more errors;
receiving information associated with an early convergence checkpoint, wherein the information associated with the early convergence checkpoint is determined, including by:

receiving a first layered decoding scheduling and a second layered decoding scheduling, wherein the LDPC decoding includes layered min-sum decoding;

determining a first potential fractional iteration count based at least in part on the first layered decoding scheduling;

determining a second potential fractional iteration count based at least in part on the second layered decoding scheduling; and selecting a minimum one of the first potential fractional iteration count or the second potential fractional iteration count to be a fractional iteration count;

using the information associated with the early convergence checkpoint to perform LDPC decoding on the LDPC encoded data up to the early convergence checkpoint and generate a decoded codeword, wherein the early convergence checkpoint is prior to a first complete iteration of the LDPC decoding;

determining whether the LDPC decoding is successful; and in the event it is determined that the LDPC decoding is successful, outputting the decoded codeword.

16. The computer program product of claim 15, wherein:

receiving the information associated with the early convergence checkpoint includes receiving a collective state signal that is based at least in part on a plurality of states associated with a plurality of variable nodes; and using the information associated with the early convergence checkpoint includes in response to the collective state signal indicating that the early convergence checkpoint has been reached, pausing the LDPC decoding, wherein the LDPC decoding includes layered min-sum LDPC decoding.

17. The computer program product of claim 15, wherein:

the LDPC encoded data includes QC-LDPC encoded data;

receiving the information associated with the early convergence checkpoint includes receiving a collective state signal that is based at least in part on a plurality of states associated with a plurality of circulants; and using the information associated with the early convergence checkpoint includes in response to the collective state signal indicating that the early convergence checkpoint has been reached, pausing the LDPC decoding, wherein the LDPC decoding includes layered min-sum LDPC decoding.

18. The computer program product of claim 15, wherein:

receiving the information associated with the early convergence checkpoint includes receiving the fractional iteration count; and using the information associated with the early convergence checkpoint includes:
  receiving a current iteration of the LDPC decoding; and
  in response to the current iteration exceeding the fractional iteration count, pausing the LDPC decoding, wherein the LDPC decoding includes layered min-sum decoding.

19. The computer program product of claim 15, wherein using the information associated with the early convergence checkpoint includes using one or more of the following: layered min-sum LDPC decoding or sum-product algorithm (SPA) LDPC decoding.

20. The computer program product of claim 15, wherein the LDPC encoded data is received via a storage system.

* * * * *